United States Patent
Seol et al.

(10) Patent No.: US 12,211,904 B2
(45) Date of Patent: Jan. 28, 2025

(54) BLACK PHOSPHORUS-TWO DIMENSIONAL MATERIAL COMPLEX AND METHOD OF MANUFACTURING THE SAME

(71) Applicants: Samsung Electronics Co., Ltd., Suwon-si (KR); UNIST (ULSAN NATIONAL INSTITUTE OF SCIENCE AND TECHNOLOGY), Ulsan (KR)

(72) Inventors: Minsu Seol, Seoul (KR); Hyeonsuk Shin, Ulsan (KR); Hyeonjin Shin, Suwon-si (KR); Hyuntae Hwang, Mokpo-si (KR); Changseok Lee, Gwacheon-si (KR); Seongin Yoon, Ulsan (KR)

(73) Assignees: Samsung Electronics Co., Ltd., Gyeonggi-do (KR); UNIST (ULSAN National Institute of Science and Technology), Ulsan (KR)

(*) Notice: Subject to any disclaimer, the term of this patent is extended or adjusted under 35 U.S.C. 154(b) by 129 days.

(21) Appl. No.: 17/398,515

(22) Filed: Aug. 10, 2021

(65) Prior Publication Data
US 2022/0157947 A1    May 19, 2022

(30) Foreign Application Priority Data
Nov. 18, 2020  (KR) .................. 10-2020-0154545

(51) Int. Cl.
*H01L 29/267*  (2006.01)
*H01L 21/02*  (2006.01)
(Continued)

(52) U.S. Cl.
CPC ...... *H01L 29/267* (2013.01); *H01L 21/02521* (2013.01); *H01L 21/02527* (2013.01);
(Continued)

(58) Field of Classification Search
None
See application file for complete search history.

(56) References Cited

U.S. PATENT DOCUMENTS 10,121,658 B2   11/2018  Kwon et al.
10,636,654 B2    4/2020  Xia
(Continued)

FOREIGN PATENT DOCUMENTS

CN    206022376 U  *  3/2017
CN    110331442 A    10/2019
(Continued)

OTHER PUBLICATIONS

English Translation of CN 206022376 U. (Year: 2017).*
(Continued)

*Primary Examiner* — Khaja Ahmad
(74) *Attorney, Agent, or Firm* — HARNESS, DICKEY & PIERCE, P.L.C.

(57) ABSTRACT

Provided are a black phosphorus-two dimensional material complex and a method of manufacturing the black phosphorus-two dimensional material complex. The black phosphorus-two dimensional material complex includes: first and second two-dimensional material layers, which each have a two-dimensional crystal structure and are coupled to each other by van der Waals force; and a black phosphorus sheet which between the first and second two-dimensional material layers and having a two-dimensional crystal structure in which a plurality of phosphorus atoms are covalently bonded.

11 Claims, 12 Drawing Sheets

(51) Int. Cl.
- *H01L 29/16* (2006.01)
- *H01L 29/20* (2006.01)
- *H01L 29/24* (2006.01)
- *H01L 29/76* (2006.01)

(52) U.S. Cl.
CPC .... *H01L 21/0254* (2013.01); *H01L 21/02568* (2013.01); *H01L 29/1606* (2013.01); *H01L 29/2003* (2013.01); *H01L 29/24* (2013.01); *H01L 29/7606* (2013.01)

(56) References Cited

U.S. PATENT DOCUMENTS

| | | | |
|---|---|---|---|
| 2012/0235119 A1* | 9/2012 | Babich | H01L 21/02664 257/27 |
| 2014/0239256 A1* | 8/2014 | Kim | H01L 21/02491 257/29 |
| 2016/0005881 A1* | 1/2016 | Fujii | H01L 21/0242 257/29 |
| 2017/0322166 A1* | 11/2017 | Zhou | G01N 27/4141 |
| 2018/0012962 A1* | 1/2018 | Yeh | H01L 29/66795 |
| 2018/0204953 A1* | 7/2018 | Zhu | H01L 29/24 |
| 2018/0294156 A1 | 10/2018 | Xia | |
| 2022/0269933 A1* | 8/2022 | Das | H01L 29/24 |
| 2022/0276325 A1* | 9/2022 | Shi | G01R 33/20 |

FOREIGN PATENT DOCUMENTS

| | | |
|---|---|---|
| CN | 110963474 A | 4/2020 |
| KR | 10-2016-0107556 A | 9/2016 |
| KR | 10-2019-0042291 A | 4/2019 |
| KR | 10-2020-0042205 A | 4/2020 |
| WO | WO-2016/190531 A1 | 12/2016 |

OTHER PUBLICATIONS

Shi-Li Yan et al ("Electrically Tunable Energy Bandgap in DualGated Ultra-Thin Black Phosphorus Field Effect Transistors") (Year: 2017).*

C. Li et al. 'Synthesis of Crystalline Black Phosphorus Thin Film on Sapphire' *Adv. Mater.*, 1703748, 2018, pp. 1-8.

L. Qiu et al. 'Selective growth of two-dimensional phosphorene on catalyst surface' *Nanoscale*, 10, 2018, pp. 2255-2259.

H. Choi 'Electronic Structures and Dirac-semimetal Properties of Black Phosphorus' *Physics and High Technology*, 26, 2017, pp. 2-6.

Y. Xu et al. 'Recent progress in black phosphorus and black-phosphorus-analogue materials: properties, synthesis and applications' *Nanoscale*, 11, 2019, pp. 14491-14527.

G. Iannaccone et al. 'Quantum engineering of transistors based on 2D materials heterostructures' *Nature Nanotech*, vol. 13, 2018, pp. 183-191.

T. Nilges et al. 'A fast low-pressure transport route to large black phosphorus single crystals' *Journal of Solid State Chemistry*, 181, 2008, pp. 1707-1711.

Z. Yang et al. Field-Effect Transistors Based on Amorphous Black Phosphorus Ultrathin Films by Pulsed Laser Deposition *Adv. Mater.* 27, 2015, pp. 3748-3754.

S. Endo et al. 'Growth of Large Single Crystals of Black Phosphorus under High Pressure' *Japanese Journal of Applied Physics*, vol. 21, No. 8, 1982, pp. L482-L484.

Y, Maruyama et al. 'Synthesis and Some Properties of Black Phosphorus Single Crystals' *Physica*, 105B, 1981, pp. 99-102.

G. Algara-Siller et al. 'Square ice in graphene nanocapillaries' *Nature*, vol. 519, 2015, pp. 443-445.

X. Li et al. 'Synthesis of thin-film black phosphorus on a flexible substrate' *2D Materials*, 2, 031002, 2015, pp. 1-6.

M. Kopf et al. 'Access and in situ growth of phosphorene-precursor black phosphorus' *Journal of Crystal Growth*, 405, 2014, pp. 6-10.

Extended European Search Report dated Mar. 23, 2022, issued in corresponding European Patent Application No. 21199488.4.

M. Birowska et al., 'The impact of hexagonal boron nitride encapsulation on the structural and vibrational properties of few layer black phosphorus' *Nanotechnology*, vol. 30, No. 19, Feb. 2019.

J. Meng et al., 'Recent progress in synthesis, properties, and applications of hexagonal boron nitride based heterostructures' *Nanotechnology*, vol. 30, No. 7, Dec. 2018.

\* cited by examiner

BLACK PHOSPHORUS-TWO DIMENSIONAL MATERIAL COMPLEX AND METHOD OF MANUFACTURING THE SAME

CROSS-REFERENCE TO RELATED APPLICATION

This application is based on and claims priority under 35 U.S.C. § 119 to Korean Patent Application No. 10-2020-0154545, filed on Nov. 18, 2020, in the Korean Intellectual Property Office, the disclosure of which is incorporated by reference herein in its entirety.

BACKGROUND

1. Field

The present disclosure relates to a black phosphorus-two dimensional material complex and a method of manufacturing the black phosphorus-two dimensional material complex.

2. Description of Related Art

Black phosphorus (BP) is a material having a layered structure, and each layer of the layered structure has a two-dimensional 2D crystal structure in which phosphorus (P) atoms are planarly bonded. BP has semiconductor characteristics and a band gap energy of about 0.3 eV to about 1.5 eV depending on the thickness thereof. In addition, BP has a high charge mobility of about 1000 $cm^2/Vs$ and a high on/off current ratio of about $10^4$ to about $10^5$ and is thus applied to electronic devices in various fields.

2D BP refers to a 2D material having a sheet shape with a thickness of several tens of nanometers (nm) or less. 2D BP may be prepared by performing a mechanical or chemical exfoliation process on bulk BP, but it is difficult to apply this method to prepare 2D BP having a large area.

SUMMARY

Provided are a black phosphorus (BP)-two dimensional (2D) material complex and a method of manufacturing the black phosphorus-two dimensional material complex.

Additional aspects will be set forth in part in the description which follows and, in part, will be apparent from the description, or may be learned by practice of the presented embodiments of the disclosure.

According to an aspect of an embodiment, a black phosphorus-two dimensional material complex includes: first and second two-dimensional material layers each having a two-dimensional crystal structure and being configured to be coupled to each other by van der Waals force; and a black phosphorus sheet between the first and second two-dimensional material layers and having a two-dimensional crystal structure in which a plurality of phosphorus atoms are covalently bonded.

In some embodiments, the first and second two-dimensional material layers may include a material different from the black phosphorus sheet.

In some embodiments, the first and second two-dimensional material layers may include an identical material or different materials. Each of the first and second two-dimensional material layers may include graphene, hexagonal-boron nitride (h-BN), or transition metal dichalcogenide (TMD).

In some embodiments, each of the first and second two-dimensional material layers may have a thickness of about 10 nm or less.

In some embodiments, the black phosphorus sheet may have a thickness of about 10 nm or less. The black phosphorus sheet may include one to fifty layers.

In some embodiments, each of the first and second two-dimensional material layers may be configured to be coupled to the black phosphorus sheet by van der Waals force.

In some embodiments, a distance between each of the first and second two-dimensional material layers and the black phosphorus sheet may be about 0.8 nm or less.

According to an embodiment, a black phosphorus-two dimensional material complex includes: a substrate; a two-dimensional material layer having a two-dimensional crystal structure and coupled to the substrate by van der Waals force; and a black phosphorus sheet between the substrate and the two-dimensional material layer and having a two-dimensional crystal structure in which a plurality of phosphorus atoms are covalently bonded.

In some embodiments, the two-dimensional material layer may include a material different from the black phosphorus sheet. The two-dimensional material layer may include graphene, hexagonal-boron nitride (h-BN), or transition metal dichalcogenide (TMD).

In some embodiments, the black phosphorus sheet may have a thickness of about 10 nm or less.

In some embodiments, a distance between the two-dimensional material layer and the black phosphorus sheet may be about 0.8 nm or less.

According to an embodiment, a method of manufacturing a black phosphorus-two dimensional material complex includes forming, on a substrate, a first two-dimensional material layer having a two-dimensional crystal structure; forming a black phosphorus precursor film on the first two-dimensional material layer; forming a second two-dimensional material layer having a two-dimensional crystal structure on the first two-dimensional material layer, the second two-dimensional material layer covering the black phosphorus precursor film; and applying heat and pressure to the black phosphorus precursor film to form a black phosphorus sheet having a two-dimensional crystal structure in which a plurality of phosphorus atoms are covalently bonded.

In some embodiments, the first and second two-dimensional material layers may be coupled to each other around the black phosphorus precursor film by van der Waals force.

In some embodiments, the first and second two-dimensional material layers may include a material different from the black phosphorus sheet.

In some embodiments, the first and second two-dimensional material layers may include an identical material or different materials. Each of the first and second two-dimensional material layers may include graphene, hexagonal-boron nitride (h-BN), or transition metal dichalcogenide (TMD).

In some embodiments, each of the first and second two-dimensional material layers may have a thickness of about 10 nm or less.

In some embodiments, the black phosphorus precursor film may include white phosphorus, red phosphorus, phosphorus triiodide ($PI_3$), or phosphorus trichloride ($PCl_3$).

In some embodiments, the applying heat and pressure may include applying a pressure of about 400 MPa or less to the black phosphorous precursor film. The applying heat and pressure may include heating the black phosphorus precursor film to a temperature of about 700° C. or less.

In some embodiments, the black phosphorus sheet may have a thickness of about 10 nm or less. A distance between each of the first and second two-dimensional material layers and the black phosphorus sheet may be about 0.8 nm or less.

According to an embodiment, a method of manufacturing a black phosphorus sheet includes providing a black phosphorus precursor film between first and second two-dimensional material layers; and applying heat and pressure to the black phosphorus precursor film to form a black phosphorus sheet having a two-dimensional crystal structure in which a plurality of phosphorus atoms are covalently bonded.

In some embodiments, the first and second two-dimensional material layers may be coupled to each other around the black phosphorus precursor film by van der Waals force.

In some embodiments, the applying heat and pressure may include applying a pressure of about 400 MPa or less to the black phosphorous precursor film and heating the black phosphorus precursor film to a temperature of about 700° C. or less.

According to embodiment, a method of manufacturing a black phosphorus-two dimensional material complex includes forming a black phosphorus precursor film on a substrate; forming a two-dimensional material layer having a two-dimensional crystal structure on the substrate to cover the black phosphorus precursor film; and applying heat and pressure to the black phosphorus precursor film to form a black phosphorus sheet having a two-dimensional crystal structure in which a plurality of phosphorus atoms are covalently bonded.

In some embodiments, the black phosphorus precursor film may include white phosphorus, red phosphorus, $PI_3$, or $PCl_3$.

In some embodiments, the substrate and the two-dimensional material layer may be coupled to each other around the black phosphorus precursor film by van der Waals force.

In some embodiments, the two-dimensional material layer may include a material different from the black phosphorus sheet.

In some embodiments, the applying heat and pressure may include applying a pressure of about 400 MPa or less to the black phosphorous precursor film and heating the black phosphorus precursor film to a temperature of about 700° C. or less.

According to an embodiment, a method of manufacturing a black phosphorus sheet includes providing a black phosphorus precursor film between a substrate and a two-dimensional material layer; and applying heat and pressure to the black phosphorus precursor film to form a black phosphorus sheet having a two-dimensional crystal structure in which a plurality of phosphorus atoms may be covalently bonded.

In some embodiments, the substrate and the two-dimensional material layer may be coupled to each other around the black phosphorus precursor film by van der Waals force.

In some embodiments, the applying heat and pressure may include applying a pressure of about 400 MPa or less to the black phosphorous precursor film and heating the black phosphorus precursor film to a temperature of about 700° C. or less.

According to an embodiment, an electronic device includes a black phosphorus sheet having a two-dimensional crystal structure in which a plurality of phosphorus atoms are covalently bonded; a first two-dimensional material layer provided on an upper surface of the black phosphorus sheet and having a two-dimensional crystal structure; first and second electrodes respectively on both sides of the black phosphorus sheet; and a third electrode above an upper portion of the first two-dimensional material layer.

In some embodiments, the first and second electrodes may respectively form edge contacts with both end portions of the black phosphorus sheet.

In some embodiments, the first two-dimensional material layer may include hexagonal-boron nitride (h-BN).

In some embodiments, the first and second electrodes may respectively form planar contacts with both sides of the first two-dimensional material layer.

In some embodiments, the first two-dimensional material layer may include graphene forming planar contacts with the first and second electrodes; and fluorinated graphene between the first and second electrodes.

In some embodiments, the electronic device may further include a second two-dimensional material layer provided on a lower surface of the black phosphorus sheet and having a two-dimensional crystal structure.

In some embodiments, the second two-dimensional material layer may include a material which is identical to or different from a material of the first two-dimensional material layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
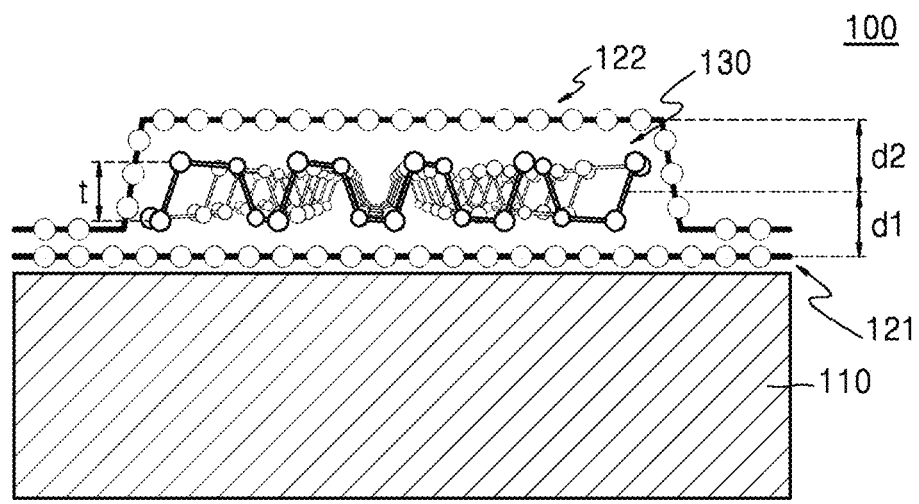
FIG. 1 is a cross-sectional view illustrating a black phosphorus (BP)-two dimensional (2D) material complex according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples are just used herein to describe technical ideas and should not be considered for purposes of limitation unless defined by the claims.

FIG. 1 is a cross-sectional view illustrating a black phosphorus (BP)-two dimensional (2D) material complex 100 according to an example embodiment.

Referring to FIG. 1, the BP-2D material complex 100 includes: first and second 2D material layers 121 and 122; and a BP sheet 130 provided between the first and second 2D material layers 121 and 122. Here, the BP sheet 130 may be encapsulated by the first and second 2D material layers 121 and 122.

The first 2D material layer 121 may be provided on an upper surface of a substrate 110. The substrate 110 may be selected from substrates including various materials such as a semiconductor substrate or an insulating substrate. The first 2D material layer 121 may include a material having a 2D crystal structure in which constituent atoms are planarly bonded. For example, the first 2D material layer 121 may include a 2D material that is different from the material of the BP sheet 130. The first 2D material layer 121 may be formed on the upper surface of the substrate 110 such that the first 2D material layer 121 may be coupled to the upper surface of the substrate 110 by van der Waals force.

The first 2D material layer 121 may have a single-layer structure or a multilayer structure. For example, the first 2D material layer 121 may have a thickness of about 10 nm or less. FIG. 1 illustrates an example in which the first 2D material layer 121 has a single-layer structure. When the first 2D material layer 121 has a multilayer structure, stacked layers of the multilayer structure may be coupled to each other by van der Waals force.

The first 2D material layer 121 may include, for example, graphene, which is a conductive 2D material. Graphene is a 2D material having a hexagonal honeycomb structure in which carbon atoms are covalently bonded in a 2D manner.

When the first 2D material layer 121 includes single-layer graphene, the first 2D material layer 121 may have a thickness of about 0.34 nm. In addition, when the first 2D material layer 121 includes multilayer graphene, the distance between stacked layers may be, for example, about 0.34 nm. Here, the distance between layers refers to the distance between the centers of the layers.

The first 2D material layer 121 may include, for example, hexagonal-boron nitride (h-BN), which is an insulating 2D material. Alternatively, the first 2D material layer 121 may include, for example, a transition metal dichalcogenide (TMD), which is a 2D material having semiconductor characteristics.

TMD is a 2D material having high thermal stability, high mechanical strength, and high thermal conductivity. For example, TMD may include: one selected from the group consisting of molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), and lead (Pb); and a chalcogen selected from the group consisting of sulfur (S), selenium (Se), and tellurium (Te). However, the listed elements are merely examples, and another material may be used as TMD.

The BP sheet 130 is provided on an upper surface of the first 2D material layer 121. Here, the BP sheet 130 provided on the first 2D material layer 121 may have an area equal to or smaller than the area of the first 2D material layer 121. That is, the BP sheet 130 may not protrude from an outer portion of the first 2D material layer 121.

The BP sheet 130 is a 2D material having a 2D crystal structure (for example, a corrugated honeycomb structure) in which phosphorus atoms are covalently bonded. The BP sheet 130 may have a single-layer structure or a multilayer structure. FIG. 1 illustrates an example in which the BP sheet 130 has a single-layer structure. However, as described later, the BP sheet 130 may have a multilayer structure. The BP sheet 130 may include, for example, one to fifty layers. In this case, the BP sheet 130 may have a thickness of about 10 nm or less.

When the BP sheet 130 has a single-layer structure, the BP sheet 130 may have a thickness (t) of about 0.5 nm. The BP sheet 130 may be coupled to the first 2D material layer 121 by van der Waals force. The distance d1 between the first 2D material layer 121 and the BP sheet 130 may be, for example, about 0.8 nm or less. Here, the distance d1 between the first 2D material layer 121 and the BP sheet 130 refers to the distance between the center of the first 2D material layer 121 and the center of the BP sheet 130.

The second 2D material layer 122 is provided on an upper surface of the BP sheet 130. Like the first 2D material layer 121, the second 2D material layer 122 may include a material having a 2D crystal structure in which constituent atoms are planarly bonded. The second 2D material layer 122 may include a 2D material that is different from the material of the BP sheet 130.

The second 2D material layer 122 may have a single-layer structure or a multilayer structure. For example, the second 2D material layer 122 may have a thickness of about 10 nm or less. FIG. 1 illustrates an example in which the second 2D material layer 122 has a single-layer structure. When the second 2D material layer 122 has a multilayer structure, stacked layers of the multilayer structure may be coupled to each other by van der Waals force.

The second 2D material layer 122 may include, for example, graphene, h-BN, or TMD. The second 2D material layer 122 may include the same material as the first 2D material layer 121. For example, both the first and second 2D material layers 121 and 122 may include graphene or h-BN. Alternatively, the second 2D material layer 122 may include a material that is different from the material of the first 2D material layer 121. For example, the first 2D material layer 121 may include h-BN, and the second 2D material layer 122 may include graphene. However, this is merely an example.

The second 2D material layer 122 may have an area equal to or larger than the area of the BP sheet 130. That is, the second 2D material layer 122 may entirely cover the BP sheet 130. Therefore, the BP sheet 130 may not protrude from an outer portion of the second 2D material layer 122. The outer portion of the first 2D material layer 121 and the outer portion of the second 2D material layer 122 which are around the BP sheet 130 may be coupled to each other by van der Waals force. As described above, the BP sheet 130 is provided between the first and second 2D material layers 121 and 122 of which the outer portions are coupled to each other by the van der Waals force, and thus, the BP sheets 130 may be encapsulated by the first and second 2D material layers 121 and 122.

The second 2D material layer 122 provided on the BP sheet 130 may be coupled to the BP sheet 130 by van der Waals force. Here, the distance d2 between the second 2D material layer 122 and the BP sheet 130 may be, for example, about 0.8 nm or less. The distance d2 between the second 2D material layer 122 and the BP sheet 130 refers to the distance between the center of the second 2D material layer 122 and the center of the BP sheet 130.

In the BP-2D material complex 100 of the example embodiment, the BP sheet 130 is provided between the first and second 2D material layers 121 and 122, which are coupled to each other by van der Waals force such that the BP sheet 130 may be protected from external environments such as oxidation. In addition, the BP sheet 130 has semiconductor characteristics, high charge mobility, and a high on/off current ratio, and thus, the BP-2D material complex 100 of the example embodiment may be applied to various electronic devices such as field effect transistors (FETs) or photodetectors.

Figure 2:
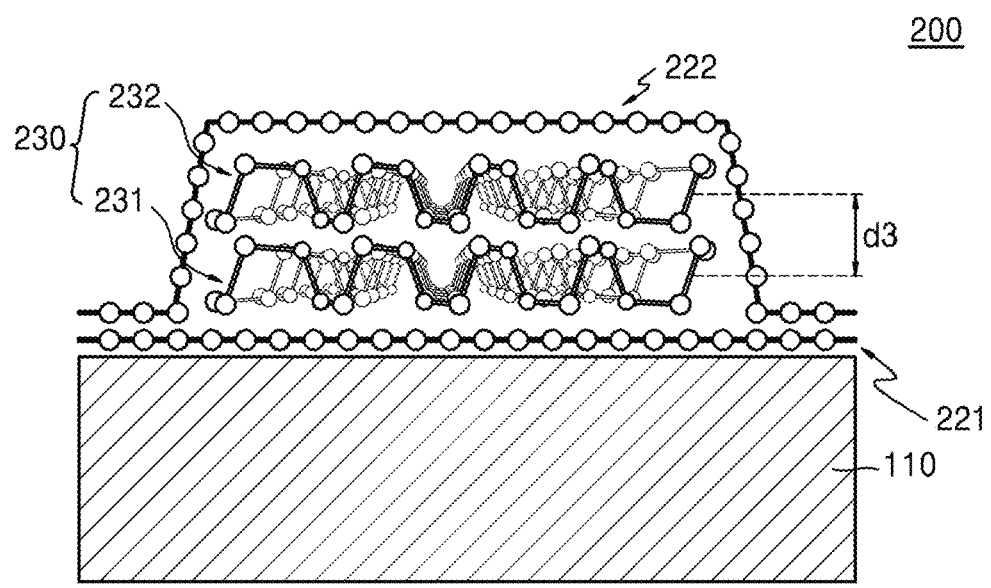
FIG. 2 is a cross-sectional view illustrating a BP-2D material complex according to another example embodiment.

FIG. 2 is a cross-sectional view illustrating a BP-2D material complex 200 according to another example embodiment. The BP-2D material complex 200 shown in FIG. 2 is the same as the BP-2D material complex 100 shown in FIG. 1 except that a BP sheet 230 has a multilayer structure.

Referring to FIG. 2, the BP sheet 230 includes a first layer 231 and a second layer 232, which are vertically stacked. Here, the distance d3 between the first layer 231 and the second layer 232 may be about 0.5 nm. The distance d3 between the first layer 231 and the second layer 232 refers to the distance between the center of the first layer 231 and the center of the second layer 232. The case in which the BP sheet 230 includes two layers, that is, the first and second layers 231 and 232, has been described. However, the present disclosure is not limited thereto, and the BP sheet 230 may include various numbers of layers. For example, the BP sheet 230 may include one to fifty layers. In this case, the BP sheet 230 may have a thickness of about 10 nm or less.

Figure 3:
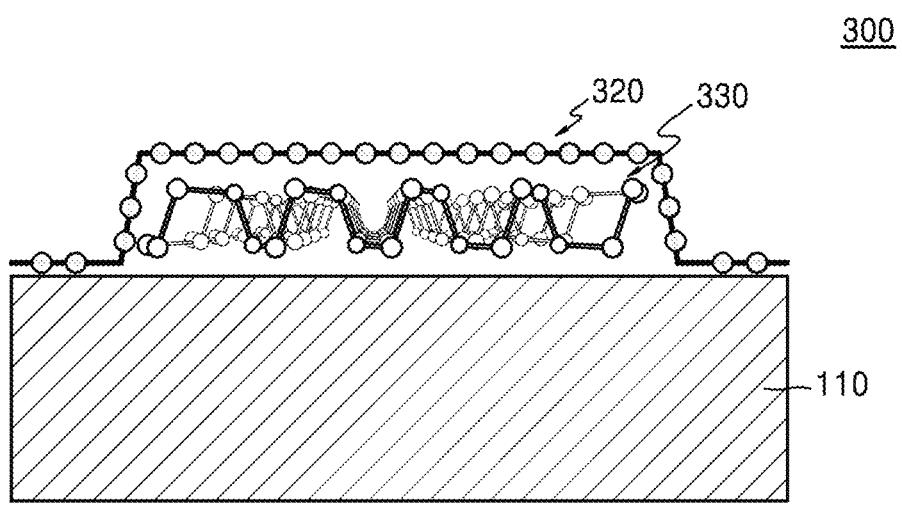
FIG. 3 is a cross-sectional view illustrating a BP-2D material complex according to another example embodiment.

FIG. 3 is a cross-sectional view illustrating a BP-2D material complex 300 according to another example embodiment. Hereinafter, differences from the above-described embodiments will be mainly described.

Referring to FIG. 3, the BP-2D material complex 300 includes a substrate 110, a 2D material layer 320, and a BP sheet 330 provided between the substrate 110 and the 2D material layer 320. In the present example embodiment, the BP sheet 330 may be encapsulated by the substrate 110 and the 2D material layer 320.

A substrate selected from substrates formed of various materials may be used as the substrate 110. The BP sheet 330 is provided on an upper surface of the substrate 110. Because BP sheets have been described, a detailed description of the BP sheet 330 will be omitted. The BP sheet 330 may have an area smaller than the area of the upper surface of the substrate 110. Therefore, the BP sheet 330 may not be provided on an outer portion of the upper surface of the substrate 110.

The BP sheet 330 may have a single-layer structure or a multi-layer structure. The BP sheet 330 may include, for example, one to fifty layers. In this case, the BP sheet 330 may have a thickness of about 10 nm or less.

The 2D material layer 320 is provided on an upper surface of the BP sheet 330. The 2D material layer 320 may include a 2D material that is different from the material of the BP sheet 330. The 2D material layer 320 may include, for example, graphene, h-BN, or TMD. Because the 2D material layer 320 is the same as the first and second 2D material layers 121 and 122 described above, a description thereof will be omitted.

The 2D material layer 320 may have an area equal to or larger than the area of the BP sheet 330. That is, the 2D material layer 320 may entirely cover the BP sheet 330. Therefore, the BP sheet 330 may not protrude from an outer portion of the 2D material layer 320. Here, the outer portion of the substrate 110 around the BP sheet 330 and the outer portion of the 2D material layer 320 around the BP sheet 330 may be coupled to each other by van der Waals force. As described above, because the BP sheet 330 is provided between the substrate 110 and the 2D material layer 320 of which the outer portions are coupled to each other by van der Waals force, the BP sheet 330 may be encapsulated by the substrate 110 and the 2D material layer 320.

The 2D material layer 320 provided on the BP sheet 330 may be coupled to the BP sheet 330 by van der Waals force. Here, the distance between the 2D material layer 320 and the BP sheet 330 may be, for example, about 0.8 nm or less.

FIGS. 4 to 9 are views illustrating a method of manufacturing a BP-2D material complex, according to an example embodiment.

Figure 4:
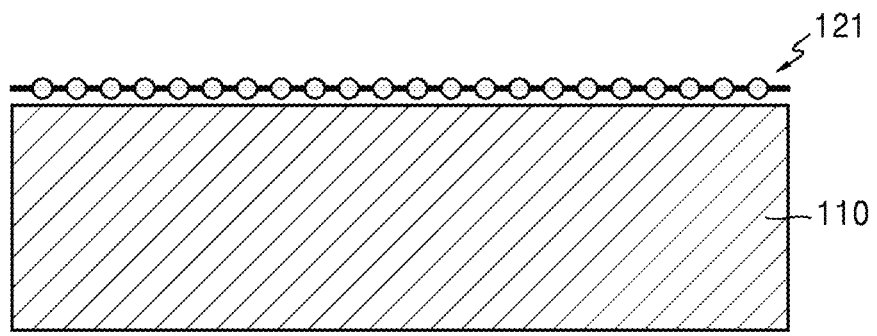
FIGS. 4 to 9 are views illustrating a method of manufacturing a BP-2D material complex, according to an example embodiment.

Referring to FIG. 4, a first 2D material layer 121 is formed on an upper surface of a substrate 110. A substrate selected from substrates including various materials such as a semiconductor substrate or an insulating substrate may be used as the substrate 110. The first 2D material layer 121 may include a material having a 2D crystal structure in which constituent atoms are planarly bonded. For example, the first 2D material layer 121 may include a 2D material that is different from the material of a BP sheet 130 (described later).

The first 2D material layer 121 may be formed on the upper surface of the substrate 110 by, for example, a transfer method. However, this is a non-limiting example. When the first 2D material layer 121 is formed on the upper surface of the substrate 110 as described above, the first 2D material layer 121 may be coupled to the upper surface of the substrate 110 by van der Waals force.

The first 2D material layer 121 may have a single-layer structure or a multilayer structure. For example, the first 2D material layer 121 may have a thickness of about 10 nm or less. FIG. 4 illustrates an example in which the first 2D material layer 121 has a single-layer structure. When the first 2D material layer 121 has a multilayer structure, stacked layers of the multilayer structure may be coupled to each other by van der Waals force.

The first 2D material layer 121 may include, for example, graphene, which is a conductive 2D material. When the first 2D material layer 121 includes single-layer graphene, the first 2D material layer 121 may have a thickness of about 0.34 nm. In addition, when the first 2D material layer 121 includes multilayer graphene, the distance between stacked layers may be, for example, about 0.34 nm.

The first 2D material layer 121 may include, for example, h-BN, which is an insulating 2D material. Alternatively, the first 2D material layer 121 may include, for example, TMD, which is a 2D material having semiconductor characteristics.

Figure 5:
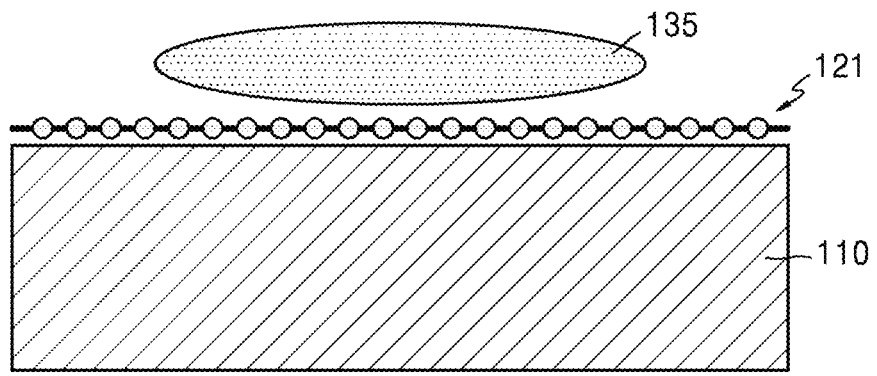

Referring to FIG. 5, a BP precursor film 135 is formed on an upper surface of the first 2D material layer 121. For example, the BP precursor film 135 may have a thickness of about 10 nm or less. The BP precursor film 135 may include, for example, white phosphorus (WP), red phosphorus (RP), phosphorus triiodide ($PI_3$), or phosphorus trichloride ($PCl_3$).

For example, the BP precursor film 135 may be formed by coating the upper surface of the first 2D material layer 121 with a solution containing $PI_3$ or $PCl_3$ and then reducing the solution to form a red phosphorus film. Alternatively, the BP precursor film 135 may be formed on the upper surface of the first 2D material layer 121 through a vapor deposition process using white phosphorus (WP) or red phosphorus (RP).

The BP precursor film 135 provided on the first 2D material layer 121 may have an area equal to or smaller than the area of the first 2D material layer 121. The BP precursor film 135 may not protrude from an outer portion of the first 2D material layer 121.

Figure 6:
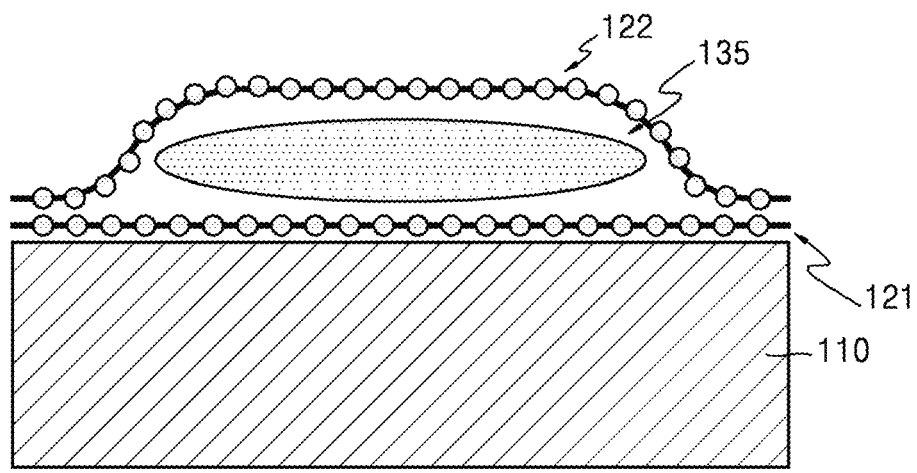

Referring to FIG. 6, a second 2D material layer 122 is formed on the BP precursor film 135. The second 2D material layer 122 may be formed on the first 2D material layer 121 by, for example, a transfer method, such that the second 2D material layer 122 may cover the BP precursor film 135. Like the first 2D material layer 121, the second 2D material layer 122 may include a material having a 2D crystal structure in which constituent atoms are planarly bonded. The second 2D material layer 122 may include a 2D material that is different from the material of the BP sheet 130.

The second 2D material layer 122 may have a single-layer structure or a multilayer structure. For example, the second 2D material layer 122 may have a thickness of about 10 nm or less. FIG. 6 illustrates an example in which the second 2D material layer 122 has a single-layer structure. When the second 2D material layer 122 has a multilayer structure, stacked layers of the multilayer structure may be coupled to each other by van der Waals force.

The second 2D material layer 122 may include, for example, graphene, h-BN, or TMD. The second 2D material layer 122 may include the same material as the first 2D material layer 121. For example, both the first and second 2D material layers 121 and 122 may include graphene or h-BN. Alternatively, the second 2D material layer 122 may include a material that is different from the material of the first 2D material layer 121. For example, the first 2D material layer 121 may include h-BN, and the second 2D material layer 122 may include graphene. However, this is merely an example.

The second 2D material layer 122 may have an area equal to or larger than the area of the BP precursor film 135. That is, the second 2D material layer 122 may entirely cover the BP precursor film 135. Therefore, the BP precursor film 135 may not protrude from an outer portion of the second 2D material layer 121. The outer portion of the first 2D material layer 121 around the BP precursor film 135 and the outer portion of the second 2D material layer 122 around the BP precursor film 135 may be coupled to each other by van der Waals force. Therefore, the BP precursor film 135 may be encapsulated by the first and second 2D material layers 121 and 122.

Figure 7:
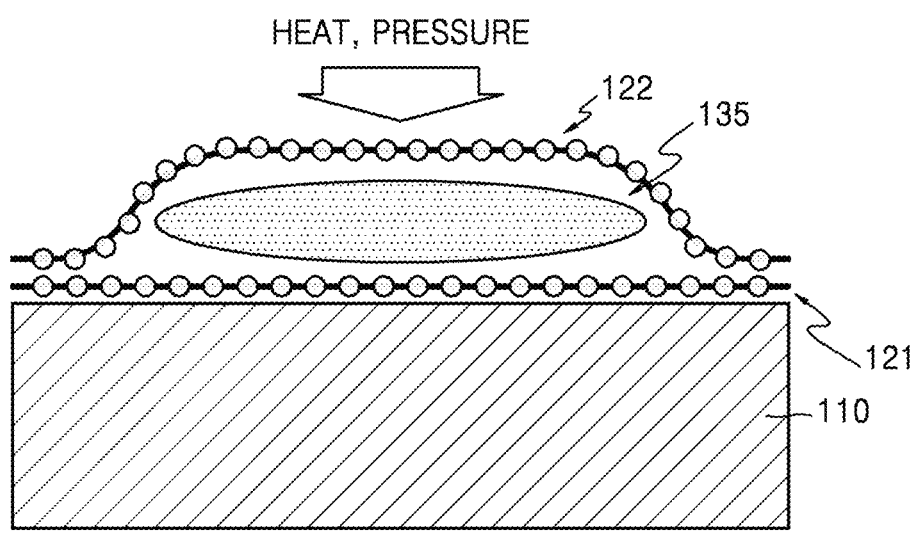
Figure 8:
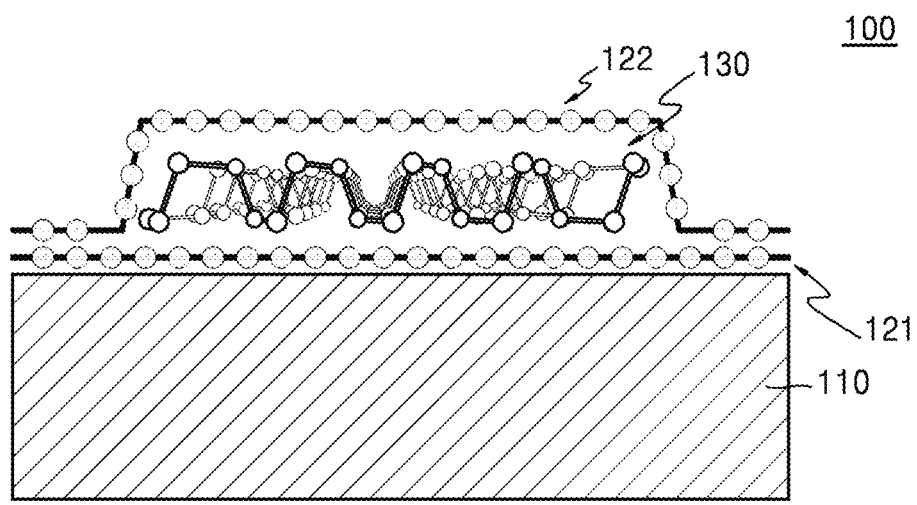

Referring to FIG. 7, as pressure and heat are applied to the BP precursor film 135 in the state shown in FIG. 6, the BP precursor film 135 is converted into the BP sheet 130, thereby forming a BP-2D material complex 100 as shown in FIG. 8.

As described above, the BP sheet 130 includes a 2D semiconductor material having a 2D crystal structure, for example, a corrugated honeycomb structure, in which phosphorus atoms are covalently bonded. In general, BP may be formed by heating white phosphorus or red phosphorus which is a precursor material at a high pressure (for example, at about 1.2 GPa). In the present example embodiment, however, the BP sheet 130 may be formed at a relatively low pressure such as atmospheric pressure.

For example, as shown in FIG. 6, the BP precursor film 135 is formed between the first and second 2D material layers 121 and 122, which are coupled to each other by van der Waals force. In this state, a great van der Waals pressure formed between the first and second 2D material layers 121 and 122 may be applied to the BP precursor film 135. For example, when both the first and second 2D material layers 121 and 122 include graphene, the van der Waals pressure formed between the first and second 2D material layers 121 and 122 may be about 1.0 GPa.

As described above, in a state in which a great van der Waals pressure formed by the first and second 2D material layers 121 and 122 is applied to the BP precursor film 135, the BP precursor film 135 may be converted into the BP sheet 130 even at a relatively low pressure such as atmospheric pressure. For example, the pressure applied to the BP precursor film 135 may be, for example, about 400 MPa or less. For example, the pressure applied to the BP precursor film 135 may be about 0.1 MPa to 200 MPa.

In addition, the temperature to which the BP precursor film 135 is heated is, for example, about 700° C. or less. The temperature of 700° C. or less refers to temperature of the process chamber for heating the black phosphorous precursor film. For example, the temperature, to which the BP precursor film 135 is heated, may be about 200° C. to about 600° C.

As described above, when the BP precursor film 135 formed between the first and second 2D material layers 121 and 122, which are coupled to each other by van der Waals force, is compressed and heated to a pressure of about 400 MPa or less and a temperature of about 700° C. or less, the BP precursor film 135 may be converted into the BP sheet 130. Here, the BP sheet 130 may have a single-layer structure or a multilayer structure depending on the thickness of the BP precursor film 135.

FIG. 8 illustrates an example in which the BP sheet 130 has a single-layer structure, and in the case, the BP sheet 130 may have a thickness t of about 0.5 nm. However, the BP sheet 130 may have a multilayer structure. For example, the BP sheet 130 may include, for example, one to fifty layers. In this case, the BP sheet 130 may have a thickness of about 10 nm or less.

In the BP-2D material complex 100, the BP sheet 130 is coupled to both the first and second 2D material layers 121 and 122 by van der Waals force. In this case, the distance from the BP sheet 130 to each of the first and second 2D material layers 121 and 122 may be about 0.8 nm or less.

Figure 9:
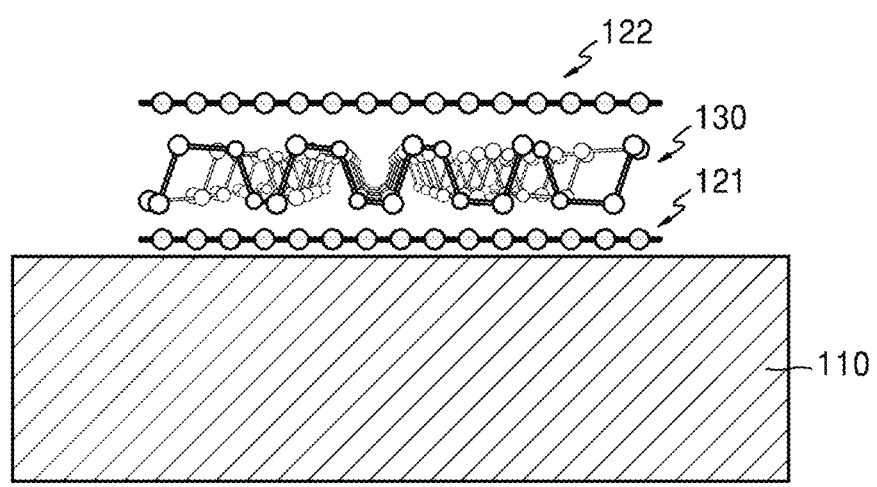

Referring to FIG. 9, the BP-2D material complex 100 may be patterned in a desired and/or alternatively predetermined shape. FIG. 9 shows a state in which outer portions of the first and second 2D material layers 121 and 122 are removed to expose both sides of the BP sheet 130. The structure shown in FIG. 9 may be applied to electronic devices such as FETs as described later.

As described above, in the present example embodiment, the BP precursor film 135 may be converted into the BP sheet 130 even at a relatively low pressure such as atmospheric pressure by using van der Waals pressure formed between the first and second 2D material layers 121 and 122. Therefore, the BP sheet 130 and the BP-2D material complex 100 including the BP sheet 130 may be easily manufactured.

Furthermore, in the process of converting the BP precursor film 135 into the BP sheet 130, BP may epitaxially grow depending on the crystal orientations of the first and second 2D material layers 121 and 122, and thus, the BP sheet 130 may have a constant charge mobility.

Figure 10A:
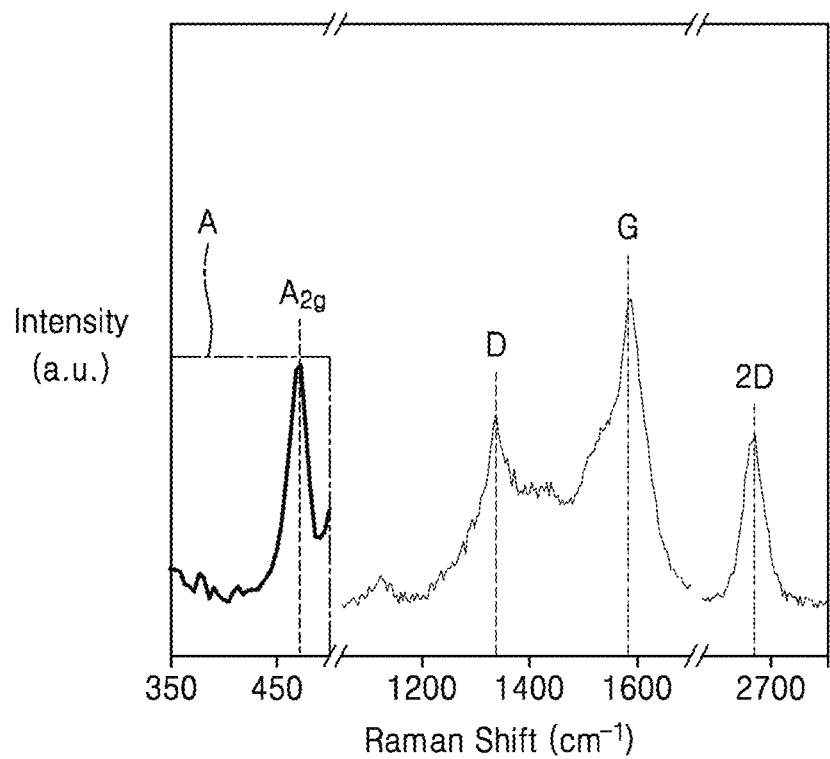
FIGS. 10A and 10B are graphs illustrating Raman spectra of a BP-2D material complex prepared by the method described with reference to FIGS. 4 to 9.
Figure 10B:
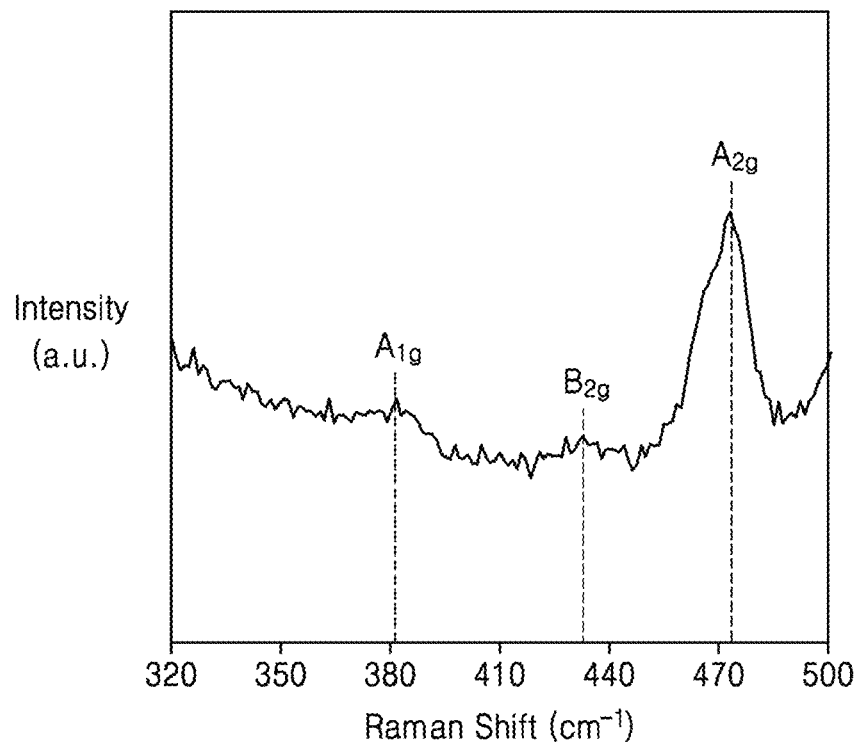

FIG. 10A illustrates a Raman spectrum of the BP-2D material complex 100 prepared by the method described with reference to FIGS. 4 to 9. FIG. 10B is an enlarged view illustrating a region A of FIG. 10A. Here, graphene was used as both the first and second 2D material layers 121 and 122.

Referring to FIGS. 10A and 10B, the D peak, G peak, and 2D peak indicate the presence of graphene, and the $A_{1g}$ peak, $B_{2g}$ peak, and $A_{2g}$ peak indicate the presence of BP. Therefore, it may be ascertained that a BP sheet was formed between graphene layers by the method described with reference to FIGS. 4 to 9.

FIGS. 11 to 15 are views illustrating a method of manufacturing a BP-2D material complex, according to another example embodiment.

Figure 11:
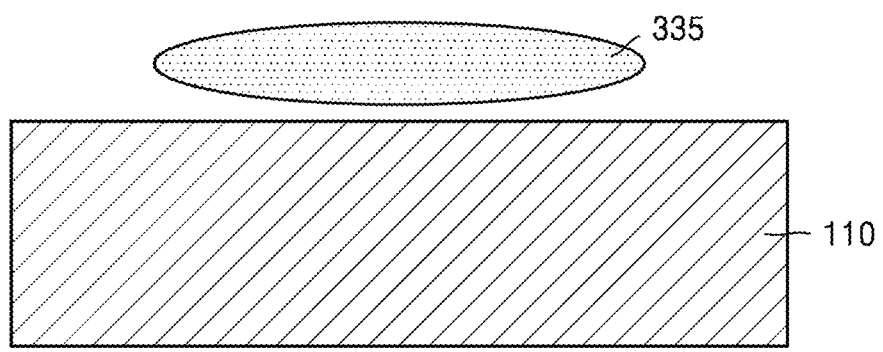
FIGS. 11 to 15 are views illustrating a method of manufacturing a BP-2D material complex, according to another example embodiment.

Referring to FIG. 11, a substrate 110 is prepared. Then, a BP precursor film 335 is formed on an upper surface of the substrate 110. A substrate selected from substrates including various materials may be used as the substrate 110. For example, the BP precursor film 335 may have a thickness of about 10 nm or less.

The BP precursor film 335 may include, for example, white phosphorus (WP), red phosphorus (RP), $PI_3$, or $PCl_3$. The BP precursor film 335 may be formed by coating the upper surface of the substrate 110 with a solution containing PIs or PClS and then reducing the solution to form a red phosphorus layer. Alternatively, the BP precursor film 335 may be formed on the upper surface of the substrate 110 through a vapor deposition process using white phosphorus or red phosphorus.

The BP precursor film 335 may have an area equal to or smaller than the area of the upper surface of the substrate 110. The BP precursor film 335 may not be formed on an outer portion of the upper surface of the substrate 110.

Figure 12:
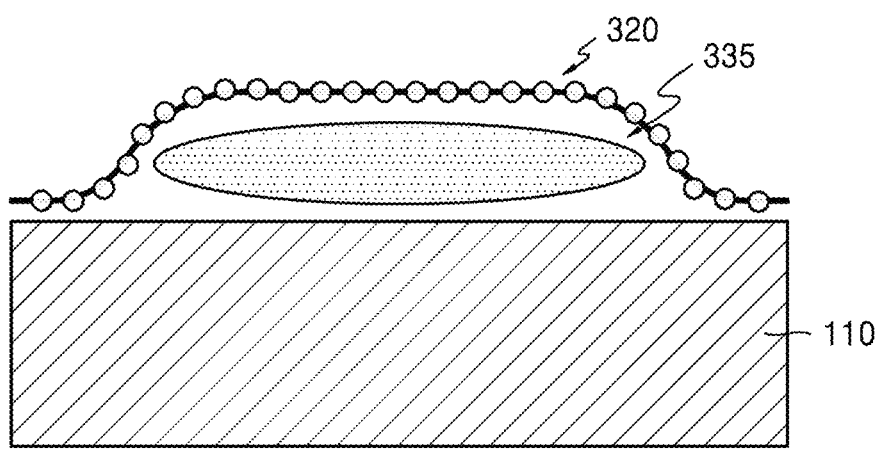

Referring to FIG. 12, a 2D material layer 320 is formed on the BP precursor film 335. The 2D material layer 320 may be formed by, for example, a transfer method, on the upper surface of the substrate 110 to cover the BP precursor film 335. The 2D material layer 320 may include a 2D material that is different from the material of a BP sheet 330 (described later). The 2D material layer 320 may include, for example, graphene, h-BN, or TMD.

The 2D material layer 320 may have a single-layer structure or a multi-layer structure. For example, the 2D material layer 320 may have a thickness of about 10 nm or less. When the 2D material layer 320 has a multilayer structure, stacked layers of the multilayer structure may be coupled to each other by van der Waals force.

The 2D material layer 320 may have an area equal to or larger than the area of the BP precursor film 335. That is, the 2D material layer 320 may entirely cover the BP precursor film 335. Therefore, the BP precursor film 335 may not protrude from an outer portion of the 2D material layer 320. The outer portion of the substrate 110 around the BP precursor film 335 and the outer portion of the 2D material layer 320 around the BP precursor film 335 may be coupled to each other by van der Waals force. Therefore, the BP precursor film 335 may be encapsulated by the substrate 110 and the 2D material layer 320.

Figure 13:
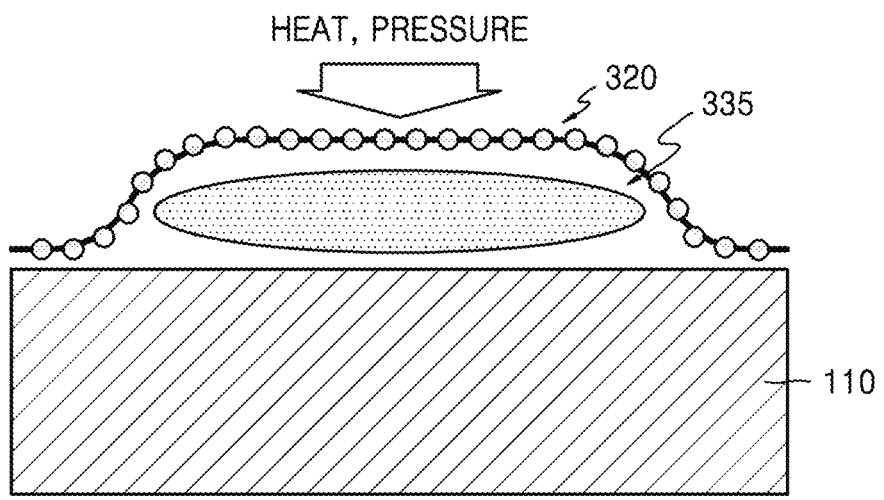
Figure 14:
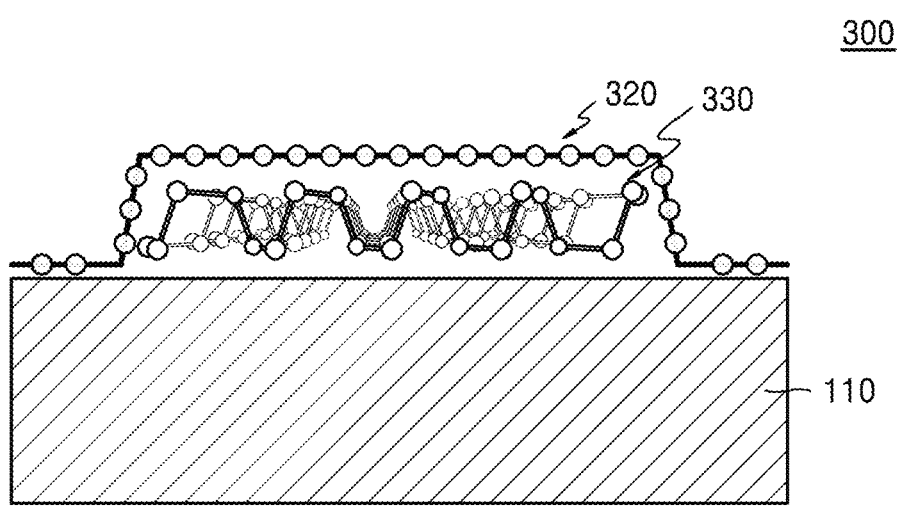

Referring to FIG. 13, as pressure and heat are applied to the BP precursor film 335 in the state shown in FIG. 12, the BP precursor film 335 is converted into the BP sheet 330, thereby forming a BP-2D material complex 300 as shown in FIG. 14.

As described above, the BP precursor film 335 is formed between the substrate 110 and the 2D material layer 320, which are coupled to each other by van der Waals force. In this state, a great van der Waals pressure formed between the substrate 110 and the 2D material layer 320 may be applied to the BP precursor film 335. In the state in which a great van der Waals pressure formed by the substrate 110 and the 2D material layer 320 is applied to the BP precursor film 335, the BP precursor film 335 may be converted into the BP sheet 330 even at a relatively low pressure such as atmospheric pressure. For example, the pressure applied to the BP precursor film 335 may be, for example, about 400 MPa or less. For example, the pressure applied to the BP precursor film 335 may be about 0.1 MPa to about 200 MPa.

The BP precursor film 335 may be heated to a temperature of, for example, about 700° C. or less. For example, the BP precursor film 335 may be heated to about 200° C. to about 600° C.

The BP sheet 330 may have a single-layer structure or a multilayer structure depending on the thickness of the BP precursor film 335. For example, the BP sheet 330 may include, for example, one to fifty layers. In this case, the BP sheet 330 may have a thickness of about 10 nm or less. In the BP-2D material complex 300, the BP sheet 330 is coupled to the 2D material layer 320 by van der Waals force. In this case, the distance between the BP sheet 330 and the 2D material layer 320 may be about 0.8 nm or less.

Figure 15:
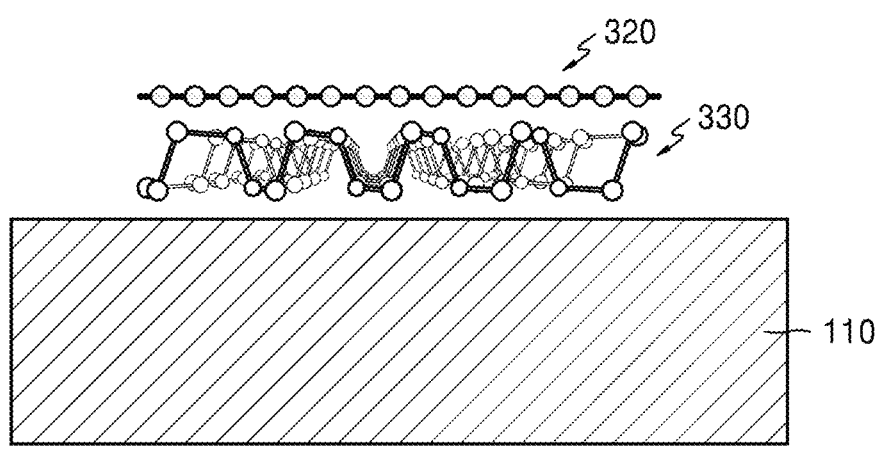

Referring to FIG. 15, the BP-2D material complex 300 may be patterned in a desired and/or alternatively predetermined shape. FIG. 15 shows a state in which both sides of the BP sheet 330 are exposed by removing outer portions of the 2D material layer 320. The structure shown in FIG. 15 may be applied to electronic devices such as FETs as described later.

As described above, in the present example embodiment, the BP sheet 330 may be formed even at a relatively low pressure such as atmospheric pressure by using van der Waals pressure formed between the substrate 110 and the 2D material layer 320.

The BP-2D material complexes 100 and 300 described above may be applied to various electronic devices such as FETs or photodetectors.

Figure 16:
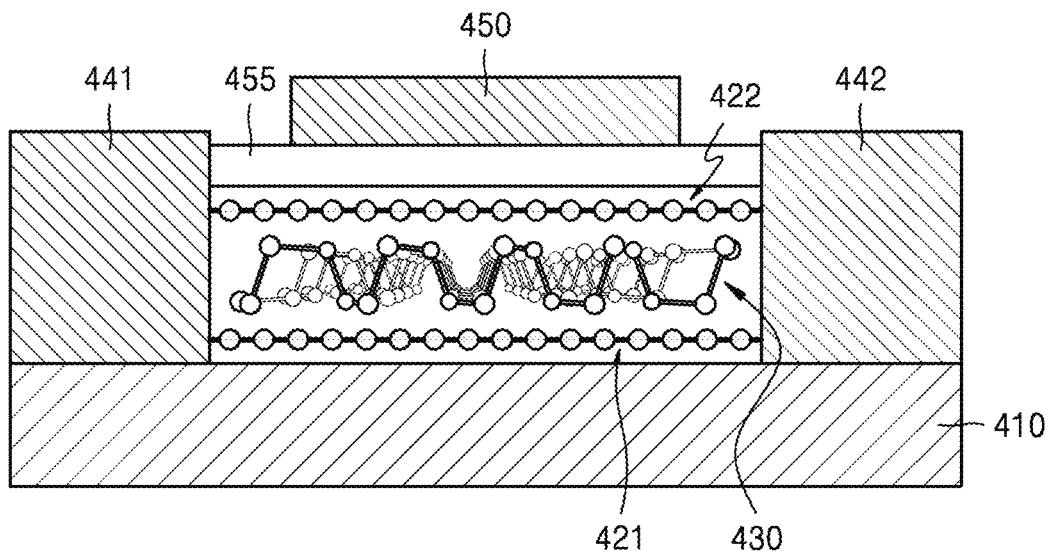
FIG. 16 is a view illustrating an electronic device according to an example embodiment.

FIG. 16 shows an electronic device 400 (for example, an FET) according to an example embodiment.

Referring to FIG. 16, the electronic device 400 includes: a BP-2D material complex; first and second electrodes 441 and 442 provided on both sides of the BP-2D material complex; and a third electrode 450 provided above an upper portion of the BP-2D material complex.

The BP-2D material complex is provided on an upper surface of a substrate 410. Here, a substrate including an insulating material may be used as the substrate 410. The BP-2D material complex may be manufactured by the method described with reference to FIGS. 4 to 9.

For example, the BP-2D material complex includes a BP sheet 430, a first 2D material layer 422 provided on an upper surface of the BP sheet 430, and a second 2D material layer 421 provided on a lower surface of the BP sheet 430. Here, both sides of the BP sheet 430 are not covered by the first and second 2D material layers 422 and 421 and are thus open.

Because BP sheets have been described above, a detailed description of the BP sheet 430 will be omitted. The BP sheet 430 may have a single-layer structure or a multilayer structure. The BP sheet 430 may include, for example, one to fifty layers. In this case, the BP sheet 430 may have a thickness of about 10 nm or less.

The first and second 2D material layers 422 and 421 are provided on the upper and lower surfaces of the BP sheet 430, respectively. The first and second 2D material layers 422 and 421 may include a 2D material that is different from the material of the BP sheet 430. For example, the first and second 2D material layers 422 and 421 may include an insulating 2D material such as h-BN.

Each of the first and second 2D material layers 422 and 421 may have a single-layer structure or a multilayer structure. For example, each of the first and second 2D material layers 422 and 421 may have a thickness of about 10 nm or less.

Each of the first and second 2D material layers 422 and 421 is coupled to the BP sheet 430 by van der Waals force. Here, the distance between the BP sheet 430 and each of the first and second 2D material layers 422 and 421 may be, for example, about 0.8 nm or less.

The first and second electrodes 441 and 442 are provided on both sides of the BP-2D material complex. The first and second electrodes 441 and 442 may be provided to form edge contacts with the BP sheet 430. For example, both lateral end portions of the BP sheet 430 are open by not being covered by the first and second 2D material layers 422 and 421, and the open lateral end portions of the opened BP sheet 430 are electrically connected to the first and second electrodes 441 and 442.

The first and second electrodes 441 and 442 may include a material having high conductivity. The first and second electrodes 441 and 442 may be a source electrode and a drain electrode, respectively. The BP sheet 430 provided between the first electrode 441 being a source electrode and the second electrode 442 being a drain electrode may serve as a channel.

The third electrode 450 may be provided on the first 2D material layer 422 between the first and second electrodes 441 and 442. The third electrode 450 may be a gate electrode. In addition, an insulating layer 455 may be provided between the first 2D material layer 422 and the third electrode 450. The insulating layer 455 may be a gate insulating layer.

Figure 17:
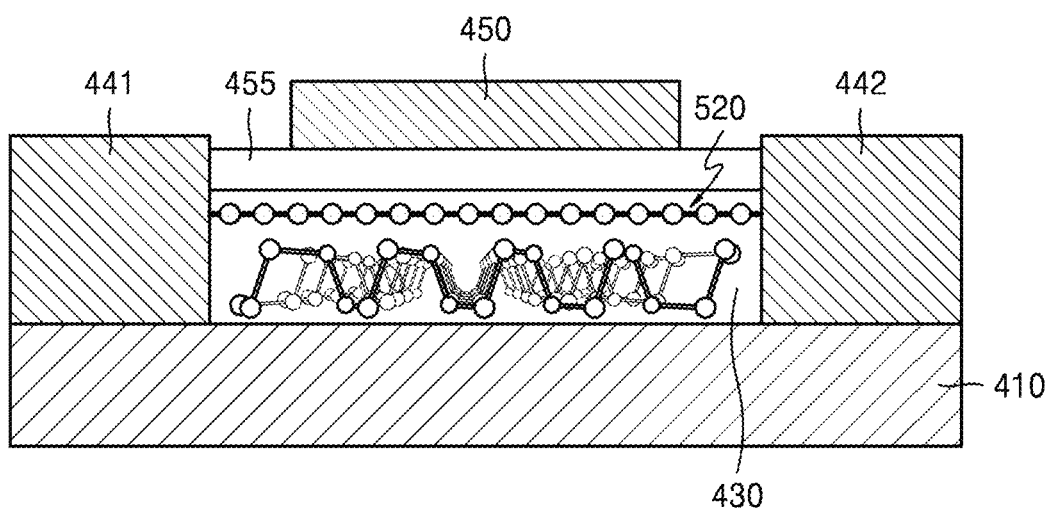
FIG. 17 is a view illustrating an electronic device according to another example embodiment.

FIG. 17 is a view illustrating an electronic device 500 according to another example embodiment. The electronic device 500 illustrated in FIG. 17 is the same as the electronic device 400 illustrated in FIG. 16 except that a 2D material layer is not provided on a lower surface of a BP sheet 430.

Referring to FIG. 17, a BP-2D material complex includes the BP sheet 430 and a 2D material layer 520 provided on an upper surface of the BP sheet 430. The 2D material layer 520 may include an insulating 2D material such as h-BN. The BP-2D material complex may be manufactured, for example, by the method described with reference to FIGS. 11 to 15.

Figure 18:
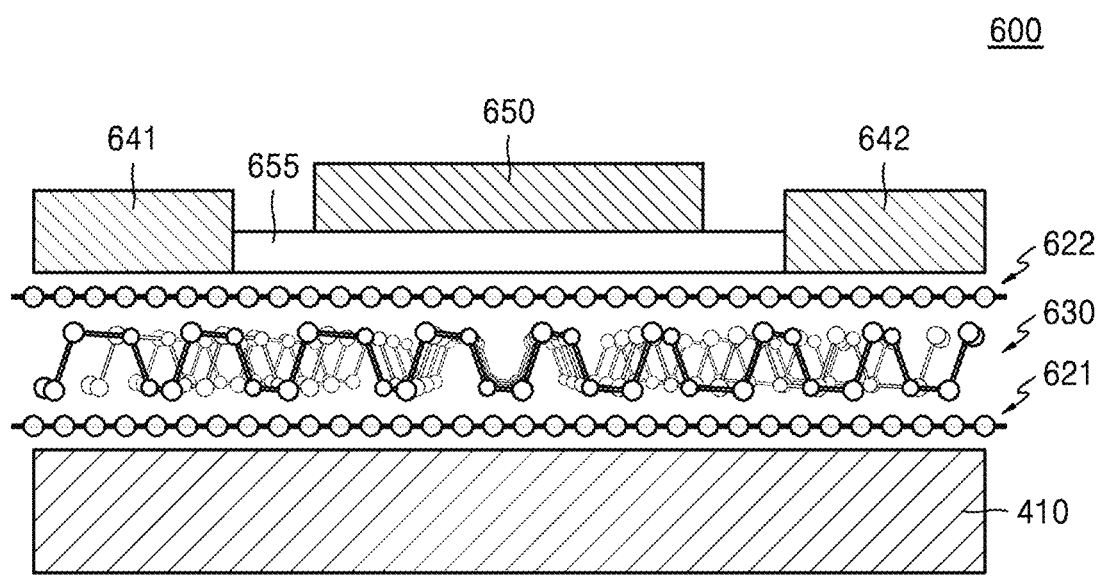
FIG. 18 is a view illustrating an electronic device according to still another example embodiment.

FIG. 18 is a view illustrating an electronic device 600 according to another example embodiment.

Referring to FIG. 18, the electronic device 600 includes: a BP-2D material complex; first and second electrodes 641 and 642 which are respectively provided on both sides of the BP-2D material complex; and a third electrode 650 which is provided above an upper portion of the BP-2D material complex.

The BP-2D material complex includes a BP sheet 630, a first 2D material layer 622 provided on an upper surface of the BP sheet 630, and a second 2D material layer 621 provided on a lower surface of the BP sheet 630. The first and second 2D material layers 622 and 621 may include a 2D material that is different from the material of the BP sheet 630. For example, the first and second 2D material layers 622 and 621 may include an insulating 2D material such as h-BN.

The first and second electrodes 641 and 642 are provided on both sides of the BP-2D material complex. The first and second electrodes 641 and 642 may be provided to form planar contacts with the BP-2D material complex. For example, the first and second electrodes 641 and 642 may respectively be in contact with upper surfaces of both sides of the first 2D material layer 622. The first and second electrodes 641 and 642 may be a source electrode and a drain electrode, respectively. The BP sheet 630 may serve as a channel. In this case, electric charges may move between the first electrode 641 and the BP sheet 630 and between the second electrode 642 and the BP sheet 630 by the tunneling effect.

The third electrode 650 may be provided above an upper portion of the first 2D material layer 622 between the first and second electrodes 641 and 642, and an insulating layer 655 may be provided between the first 2D material layer 622 and the third electrode 650. The third electrode 650 may be a gate electrode, and the insulating layer 655 may be a gate insulating layer.

Figure 19:
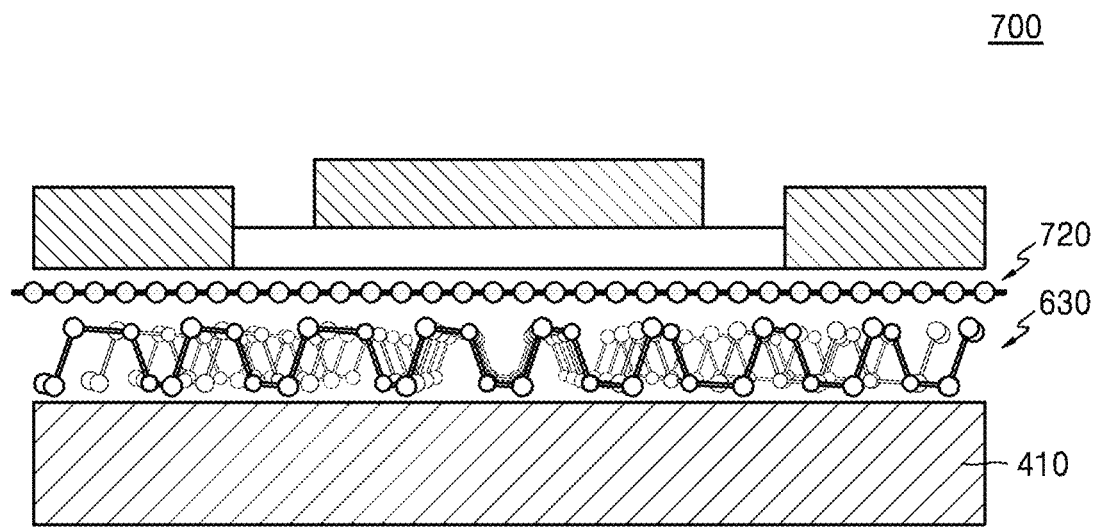
FIG. 19 is a view illustrating an electronic device according to another example embodiment.

FIG. 19 is a view illustrating an electronic device 700 according to another example embodiment. The electronic device 700 illustrated in FIG. 19 is the same as the electronic device 600 illustrated in FIG. 18 except that a 2D material layer is not provided on a lower surface of a BP sheet 630.

Referring to FIG. 19, a BP-2D material complex includes the BP sheet 630 and a 2D material layer 720 provided on an upper surface of the BP sheet 630. The 2D material layer 720 may include an insulating 2D material such as h-BN.

Figure 20:
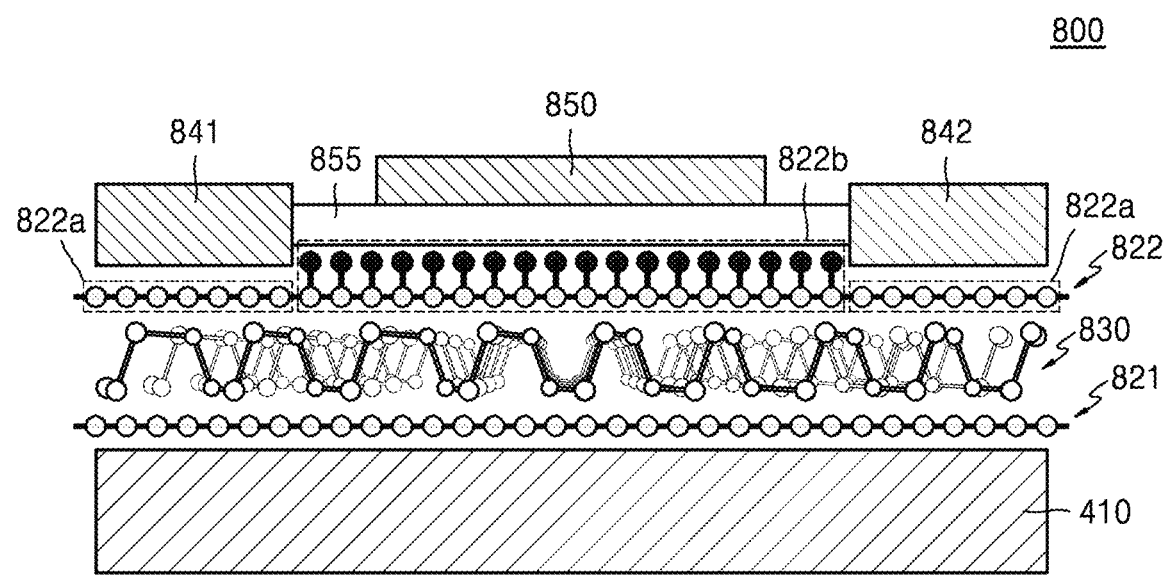
FIG. 20 is a view illustrating an electronic device according to another example embodiment.

FIG. 20 is a view illustrating an electronic device 800 according to another example embodiment.

Referring to FIG. 20, the electronic device 800 includes: a BP-2D material complex; first and second electrodes 841 and 842 which are respectively provided on both sides of the BP-2D material complex; and a third electrode 850 which is provided above an upper portion of the BP-2D complex.

The BP-2D material complex includes a BP sheet 830, a first 2D material layer 822 provided on an upper surface of the BP sheet 830, and a second 2D material layer 821 provided on a lower surface of the BP sheet 830. The first 2D material layer 822 provided on the upper surface of the BP sheet 830 may include fluorinated graphene 822b and graphene 822a provided on both sides of the fluorinated graphene 822b. Here, the fluorinated graphene 822b is an insulating material and may be formed by fluorinating the graphene 882a using, for example, $XeF_2$ or $SF_6$. The second 2D material layer 821 provided on the lower surface of the BP sheet 830 may include an insulating 2D material such as h-BN.

The first and second electrodes 841 and 842 are provided on both sides of the BP-2D material complex. The first and second electrodes 841 and 842 may be provided to form planar contacts with the BP-2D material complex. For example, the first and second electrodes 841 and 842 may be provided on the first 2D material layer 822 and may be in contact with the graphene 822a which is provided on both sides of the fluorinated graphene 822b.

The first and second electrodes 841 and 842 may be a source electrode and a drain electrode, respectively. The BP sheet 830 may serve as a channel. The third electrode 850 may be provided above an upper portion of the first 2D material layer 822 between the first and second electrodes 841 and 842, and an insulating layer 855 may be provided between the first 2D material layer 822 and the third electrode 850. The third electrode 850 may be a gate electrode, and the insulating layer 855 may be a gate insulating layer.

Figure 21:
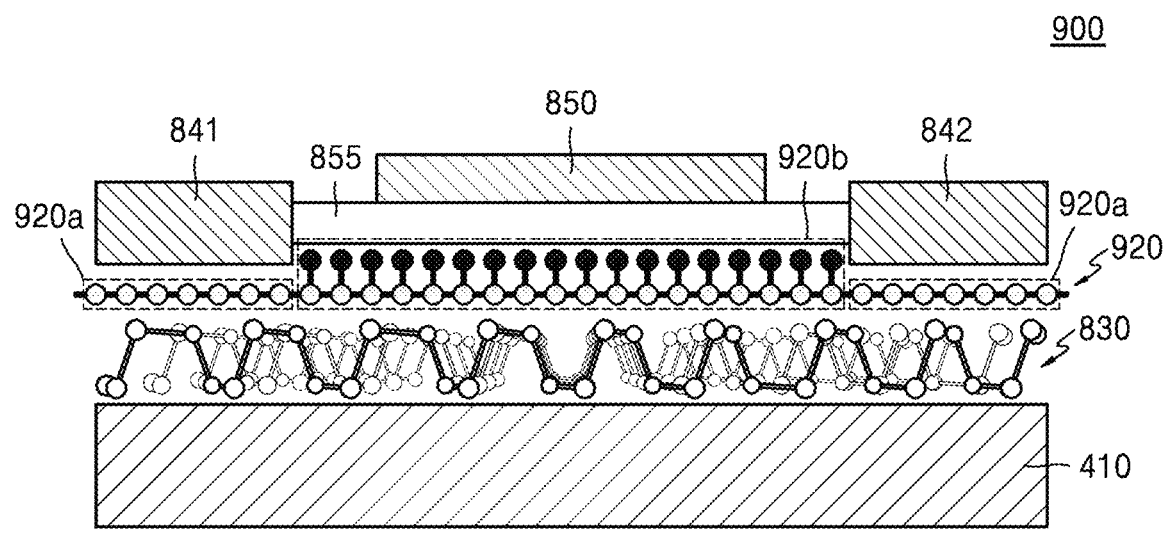
FIG. 21 is a view illustrating an electronic device according to another example embodiment.

FIG. 21 is a view illustrating an electronic device 900 according to another example embodiment. The electronic device 900 illustrated in FIG. 21 is the same as the electronic device 800 illustrated in FIG. 20 except that a 2D material layer is not provided on a lower surface of a BP sheet 830.

Referring to FIG. 21, a BP-2D material complex includes the BP sheet 830 and a 2D material layer 920 provided on an upper surface of the BP sheet 830. Here, the 2D material layer 920 may include fluorinated graphene 920b and graphene 920a provided on both sides of the fluorinated graphene 920b.

As described above, according to the one or more of the above embodiments, a BP sheet and a BP-2D material complex may easily be formed even at a relatively low pressure such as atmospheric pressure by using a great van der Waals pressure formed between first and second 2D material layers or between a substrate and a 2D material layer.

In addition, because the BP sheet is encapsulated by the first and second 2D material layers, the BP sheet may be protected from external environments such as an oxidizing environment. Because the BP sheet has semiconductor characteristics, high charge mobility, and a high on/off current ratio, the BP-2D material complex including the BP sheet may be applied to various electronic devices such as FETs or photo detectors. While embodiments have been described above, the embodiments are examples, and those of ordinary skill in the art could easily make various changes or modifications in the embodiments.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
   a black phosphorus sheet having a two-dimensional crystal structure in which a plurality of phosphorus atoms are covalently bonded;
   a first two-dimensional material layer on an upper surface of the black phosphorus sheet and having a two-dimensional crystal structure;
   a second two-dimensional material layer on a lower surface of the black phosphorus sheet and having a two-dimensional crystal structure;
   first and second electrodes respectively on both sides of the black phosphorus sheet;
   an insulating layer on the first two-dimensional material layer; and
   a third electrode above an upper portion of the first two-dimensional material layer, wherein
   the insulating layer extends laterally between the first and second electrodes,
   an uppermost surface of the insulating layer is lower than uppermost surfaces of the first and second electrodes,
   the first and second electrodes respectively contact opposing side surfaces of each of the first two-dimensional material layer and the second two-dimensional material layer, such that the first and second electrodes respectively form edge contacts with end portions of the first two-dimensional material layer and the second two-dimensional material layer, and
   the first two-dimensional material layer and the second two-dimensional material layer are different materials than the black phosphorous sheet.

2. The electronic device of claim 1, wherein the first and second electrodes respectively form edge contacts with both end portions of the black phosphorus sheet.

3. The electronic device of claim 1, wherein the first two-dimensional material layer comprises hexagonal-boron nitride (h-BN).

4. The electronic device of claim 1, wherein
   the second two-dimensional material layer comprises a material which is identical to a material of the first two-dimensional material layer.

5. The electronic device of claim 1, wherein the second two-dimensional material layer comprises a material which is different from a material of the first two-dimensional material layer.

6. The electronic device of claim 1, wherein
at least one of the first and second electrodes does not extend over an upper surface of the first two-dimensional material layer.

7. The electronic device of claim 1, wherein
at least one of the first and second electrodes does not directly contact an upper surface of the black phosphorus sheet.

8. The electronic device of claim 1, wherein
the third electrode is on top of the insulating layer.

9. The electronic device of claim 1, wherein
a width of the insulating layer is equal to a width of the second two-dimensional material layer.

10. The electronic device of claim 9, wherein
the width of the insulating layer is equal to a width of the first two-dimensional material layer.

11. The electronic device of claim 1, wherein
a width of the black phosphorous sheet is less than or equal to a width of the insulating layer.

* * * * *